(12) United States Patent
Puskarich et al.

(10) Patent No.: US 9,329,685 B1
(45) Date of Patent: May 3, 2016

(54) CONTROLLING ELECTRONIC DEVICES USING FORCE SENSORS

(71) Applicant: Apple Inc., Cupertino, CA (US)

(72) Inventors: Paul G. Puskarich, Cupertino, CA (US); Corey S. Provencher, Cupertino, CA (US); Craig C. Leong, Cupertino, CA (US); Brandon D. Slack, Toronto (CA)

(73) Assignee: Apple Inc., Cupertino, CA (US)

( * ) Notice: Subject to any disclaimer, the term of this patent is extended or adjusted under 35 U.S.C. 154(b) by 227 days.

(21) Appl. No.: 13/799,098

(22) Filed: Mar. 13, 2013

(51) Int. Cl.
*G08B 21/00* (2006.01)
*G06F 3/01* (2006.01)
*G06F 3/045* (2006.01)
*G06F 3/02* (2006.01)
*G01G 9/00* (2006.01)
*G01G 3/14* (2006.01)

(52) U.S. Cl.
CPC ..................................... *G06F 3/016* (2013.01)

(58) Field of Classification Search
CPC . G08B 21/182; H04M 2250/12; G01G 19/12; G01G 19/4144; G01G 19/4142; G01G 3/14
USPC ........................................................ 340/665
See application file for complete search history.

(56) References Cited

U.S. PATENT DOCUMENTS

| 7,595,788 | B2 | 9/2009 | Son | |
| 7,790,992 | B1* | 9/2010 | Abbruscato | G01G 19/44 177/244 |
| 8,351,993 | B2 | 1/2013 | Nunes | |
| 2007/0261894 | A1* | 11/2007 | Harish | G01G 7/06 177/211 |
| 2008/0211766 | A1* | 9/2008 | Westerman | G06F 3/038 345/156 |
| 2011/0037734 | A1 | 2/2011 | Pance et al. | |
| 2011/0038114 | A1 | 2/2011 | Pance et al. | |
| 2011/0254774 | A1* | 10/2011 | Yamamoto | G06F 1/1643 345/169 |
| 2013/0154998 | A1* | 6/2013 | Yang | H03K 17/9625 345/174 |
| 2013/0321216 | A1* | 12/2013 | Jervis | G06F 1/1616 343/702 |
| 2014/0224551 | A1* | 8/2014 | Turner | G01G 5/006 177/1 |

* cited by examiner

*Primary Examiner* — Jack K Wang

(74) *Attorney, Agent, or Firm* — Brownstein Hyatt Farber Schreck, LLP

(57) ABSTRACT

Systems and methods for controlling electronic devices using force sensors include a plurality of force sensors configured such that they are operable to support one or more housings on one or more surfaces. When force is exerted on the housing, this force is measured by the force sensors as force data. This force data is interpreted as at least one input for an electronic device. In some implementations, the electronic device may include various different statuses. In such implementations, the status of the electronic device may be determined and the input that the force data is interpreted as may depend on the determined status of the electronic device. In various cases, the status of the electronic device may be a combination of one or more different statuses.

20 Claims, 7 Drawing Sheets

CONTROLLING ELECTRONIC DEVICES USING FORCE SENSORS

TECHNICAL FIELD

This disclosure relates generally to input devices, and more specifically to using force sensors to control electronic devices.

BACKGROUND

Electronic devices (such as laptop computing devices, tablet computing devices, desktop computing devices, mobile computing devices, cellular telephones, digital music and/or video players, and so on) may be configured to receive input from one or more input devices. Such input devices may be external to the electronic device and/or may be incorporated into the electronic device. In many cases, such input devices require extensive hardware, special surfaces, and/or other components that increase the cost of the input devices. Further, incorporation of many input devices into electronic devices may position the input device such that it is not usable during various states of the electronic device (such as a laptop keyboard or track pad that is hidden when a laptop lid is closed).

SUMMARY

The present disclosure discloses systems and methods for controlling electronic devices using force sensors. A plurality of force sensors may be configured such that they are operable to support one or more housings on one or more surfaces. When force is exerted on the housing, this force may be measured by the force sensors as force data. This force data may be interpreted (such as by one or more processing units) as at least one input for an electronic device.

In some implementations, the electronic device may include various different statuses. In such implementations, the status of the electronic device may be determined and the input that the force data is interpreted as may depend on the determined status of the electronic device. In various cases, the status of the electronic device may be a combination of one or more different statuses.

In this way, an input device that may not require extensive hardware, special surfaces, and/or other costly components may be provided. Further, such an input device may enable the electronic device itself to be utilized as an input device.

Although the systems and methods are described herein as including force sensors that are operable to support one or more housings on one or more surfaces, it is understood that this is for the purposes of example. In various implementations, structures operable to support one or more housings and/or electronic devices on one or more surfaces may not be utilized. Instead, force sensors may be located in such embodiments in a bottom portion of an electronic device or housing, a top portion of an electronic device or housing, a hinge between a lid and base of an electronic device or housing, a specific portion of an electronic device or housing, and so on without departing from the scope of the present disclosure.

It is to be understood that both the foregoing general description and the following detailed description are for purposes of example and explanation and do not necessarily limit the present disclosure. The accompanying drawings, which are incorporated in and constitute a part of the specification, illustrate subject matter of the disclosure. Together, the descriptions and the drawings serve to explain the principles of the disclosure.

DETAILED DESCRIPTION

The description that follows includes sample systems, methods, and computer program products that embody various elements of the present disclosure. However, it should be understood that the described disclosure may be practiced in a variety of forms in addition to those described herein.

The present disclosure discloses systems and methods for controlling electronic devices using force sensors. A plurality of force sensors may be configured such that they are operable to support one or more housings on one or more surfaces. When force is exerted on the housing, this force may be measured by the force sensors as force data. This force data may be interpreted (such as by one or more processing units) as at least one input for an electronic device.

In some implementations, the electronic device may include various different statuses. In such implementations, the status of the electronic device may be determined and the input that the force data is interpreted as may depend on the determined status of the electronic device.

In this way, an input device that may not require extensive hardware, special surfaces, and/or other costly components may be provided. Further, such an input device may enable the electronic device itself to be utilized as an input device.

Figure 1:
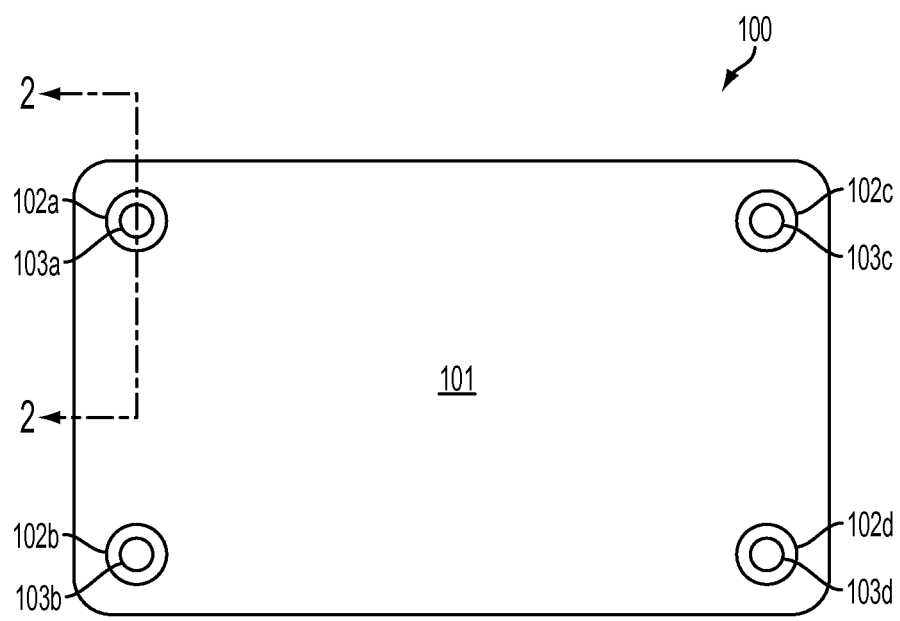
FIG. 1 is a bottom plan view illustrating a system for controlling electronic devices using force sensors.

FIG. 1 is a bottom plan view illustrating a system 100 for controlling electronic devices using force sensors. The system includes an electronic device 101. As illustrated, the electronic device is a laptop computer. However, it is understood that this is an example. In various other implementations, the electronic device may be any kind of electronic device, such as a tablet computing device, a desktop computing device, a mobile computing device, a cellular telephone, a digital music and/or video player, and so on. As also illustrated, the system includes a plurality of moveable feet 102a-102d, each of the moveable feet including a force sensor 103a-103d.

As can be seen from FIG. 1, the moveable feet 102a-102d are positioned such that they are operable to support the electronic device 101 when the electronic device is placed on one or more surfaces, such as a table, a desk, a lap, and so on. When force is exerted on the electronic device, the force may be measured by one or more of the force sensors 103a-103d as force data.

For example, when a user presses down on a portion of the electronic device 101, one or more of the force sensors 103a-103d may measure the force of the user's press as force data. By comparing force data from the various force sensors, the location where the user exerted force may be determined (as the detected force may be greater closer to where the user pressed down, and closer to a particular force sensor, and may be lesser further from where the user pressed down, and closer to a different force sensor). By comparing current force data with previous force data, movement of a user's touch across the electronic device may be determinable.

However, forces other than those exerted by a user may also be detected. For example, if the moveable feet 102a-102d support the electronic device 101 on a surface, the weight of the electronic device itself may exert a force that is detectable by the force sensors 103a-103d.

Figure 2:
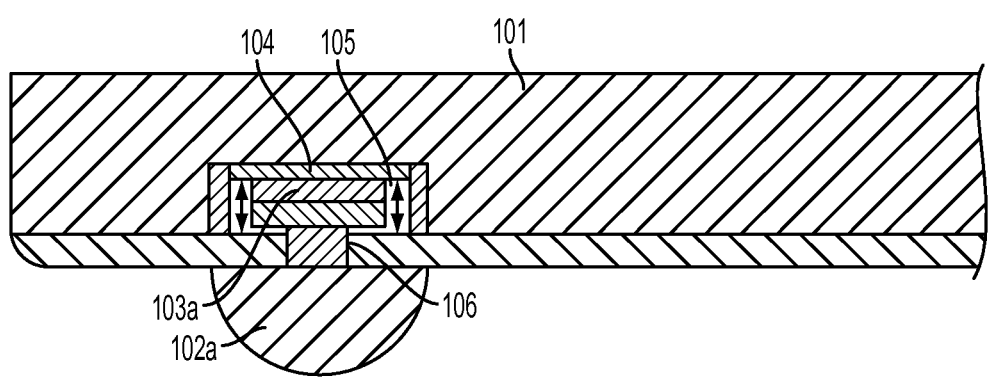
FIG. 2 is a side cross sectional view of a portion of the electronic device of the system of FIG. 1 taken along the line 2-2 in FIG. 1.

FIG. 2 is a side cross sectional view of a portion of the electronic device 101 of the system of FIG. 1 taken along the line 2-2 in FIG. 1. As illustrated, the moveable foot 102a is operable to move in and/or out of a cavity 105 of the electronic device 101 via an aperture 106 in response to force exerted on the electronic device. As the moveable foot moves in and/or out of the cavity, the force sensor 103a measures the change in force as force data.

Figure 3:
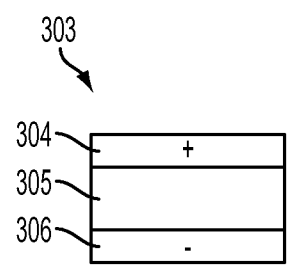
FIG. 3 is side plan view of an alternative embodiment of a force sensor.

FIG. 3 illustrates a side plan view illustrating another force sensor 303 that may be utilized in various other implementations. As illustrated, the force sensor includes a positive capacitance plate 304 separated from a negative capacitance plate 306 by a flexible member 305 (which may be composed of silicone and/or another flexible material). When force is exerted on the force sensor, the flexible member may flex, allowing the positive and negative capacitance plates to move closer to and/or further from each other. Changes in capacitance related to the position of the positive and negative capacitance plates may detected and utilized to generate data regarding the force exerted on the force sensor.

Returning to FIG. 2, as illustrated, in some cases the cavity may be lined with a material 104, which may be rigid in some implementations.

Returning to FIG. 1, when force data is measured by one or more of the force sensors 103a-103d, the force data may be interpreted as one or more inputs. Such inputs may be one or more navigational instructions, one or more instructions for one or more applications currently executing on the electronic device 101, and so on. In some implementations, the input which the force data is interpreted as may be user configurable.

For example, when force data is received, the force data may be interpreted as directional and/or other navigational information. By comparing force data from the various force sensors 103a-103d, the location where force was exerted may be determined (as the detected force may be greater closer to where a user pressed down, and closer to a particular force sensor, and may be lesser further from where a user pressed down, and closer to a different force sensor). By comparing current force data with previous force data, movement of a touch across the electronic device may be determinable. In some cases, the force data may be interpreted similar to the arrow keys of a keyboard (such as pressure near the top of the electronic device 101 corresponds to an 'up arrow' input and so on).

Further, in some cases the electronic device may have one or more different statuses. For example, a laptop computer may include a lid and may have a closed lid status and an open lid status. The laptop computer may also have an active state and one or more inactive states (such as a sleep state, a hibernate state, a standby state, and so on). Further, the laptop computer may have an 'on table' state when the laptop is positioned on a table or other even surface and an 'elevated state' when the laptop is positioned on an uneven surface such as a lap (which may be detectable by comparing differing force data from various of the force sensors 103a-103d).

In various cases, the status of the electronic device 101 may be a combination of one or more different statuses. For example, a laptop computer may simultaneously have a closed lid status or an open lid status, an active status or one or more inactive statuses, and an on table or elevated status. In such a case, the laptop computer may have an open lid/active/on table status at a particular point in time. It is understood that the sample statuses provided above are examples and an electronic device may have any number of different statuses (or combinations of statuses) at a given time.

In cases where the electronic device 101 has different statuses (or combinations of statuses), the status of the electronic device may be determined. The input which the force data is interpreted may then differ depending on the status of the electronic device.

For example, when force data is received when a laptop is open and a user is currently active, the force data may be interpreted as directional and/or other navigational information. By comparing force data from the various force sensors, the location where force was exerted may be determined (as the detected force may be greater closer to where a user pressed down, and closer to a particular force sensor, and may be lesser further from where a user pressed down, and closer to a different force sensor). By comparing current force data with previous force data, movement of a touch across the electronic device may be determinable. In some cases, the force data may be interpreted similar to the arrow keys of a keyboard (such as pressure near the top of the laptop corresponds to an 'up arrow' input and so on).

By way of another example, when force data is received when a laptop is open and no user is currently active, the force data may be interpreted as an instruction to switch the computer between active and inactive states or between various inactive states (such as switching an active laptop computer to a sleep mode, switching a sleeping laptop computer to a hibernate mode, and so on).

By way of a third example, when force data is received when a laptop is closed and an application is currently executing on the laptop computer, the force data may be interpreted as an instruction to the application. In a first case, the application may be a presentation software program and the instruction may include a command to switch the slide currently being presented (such as advancing to the next slide and/or returning to a previous slide) via one or more projectors and/or other output devices connected to the laptop. In such a case, a user may manipulate the presentation software during a presentation while the laptop is closed by pressing on the top of the laptop.

In a second case, the application may be a music player program and the instruction may include a command to alter the music currently being presented (such as fast forwarding the music, rewinding the music, speeding up the music, slowing down the music, and so on) via one or more speakers and/or other output devices and/or components. In such a case, a user may manipulate the music player program while the laptop is closed and the music player program is playing music by pressing on the top of the laptop.

By way of a fourth example, force data may be received indicating that a laptop computer is on a lap as opposed to an even surface such as a table. Such force may not correspond to force exerted by a user, but the force may be interpreted as a command to engage a cooling mechanism of the laptop such that the laptop does not reach a temperature that is uncomfortable for a user's lap. As such, in various cases, the force data itself may be utilized to determine a status of the electronic device, the determination of which may then be utilized to interpret the force data as one or more particular inputs.

In any of the above examples, differing force data may correspond to differing inputs in a variety of ways. In some cases, force data may be interpreted as a first input when the force is above a threshold and as a second input when the force is below threshold. In other cases, force data may be interpreted as a first input when the force is exerted on a first location of the electronic device 101 and as a second input when the force is exerted on a second location of the electronic device. It is understood that various configurations are possible without departing from the scope of the present disclosure. Further, in various cases the input as which the force data is interpreted may be user configurable.

Figure 4:
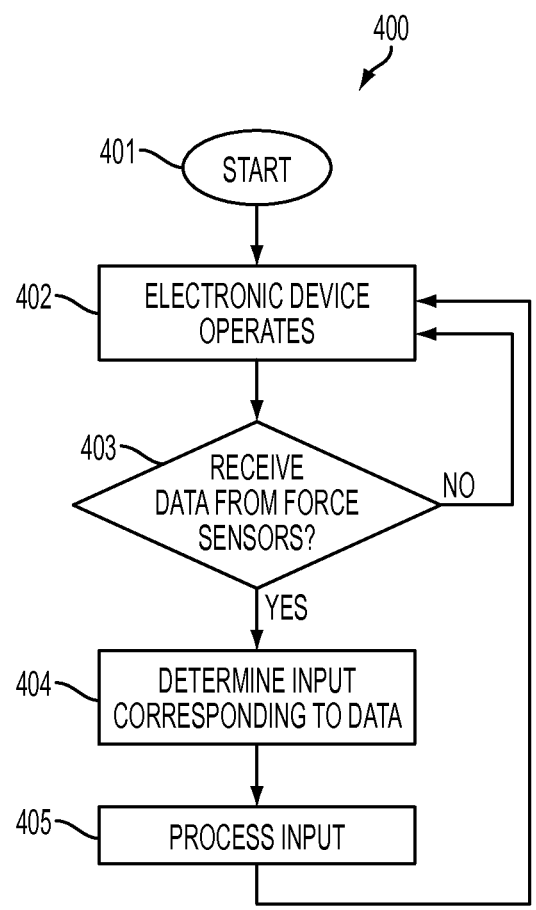
FIG. 4 is flow chart illustrating a first example method for controlling electronic devices using force sensors. This method may be performed by the system of FIG. 1.

FIG. 4 illustrates a first example method 400 for controlling electronic devices using force sensors. The method 400 may be performed by the system 100 of FIG. 1. The flow begins at block 401 and proceeds to block 402 where an electronic device operates. The flow then proceeds to block 403 where it is determined whether or not force data is received from one or more force sensors. If so, the flow proceeds to block 404. Otherwise, the flow returns to block 402 where the electronic device continues to operate.

At block 404, the force data is interpreted to determine one or more inputs that correspond to the force data. In some cases, the determination of which input to determine the force data as may be dependent on the force data and/or one or more determined statuses of the electronic device.

The flow then proceeds to block 405 where the electronic device processed the determined input. Finally, the flow returns to block 402 where the electronic device continues to operate.

Although the method 400 is illustrated and described above as including particular operations performed in a particular order, it is understood that this is for the purposes of example. In other implementations, different orders of the same and/or different operations may be performed without departing from the scope of the present disclosure. For example, in one or more implementations, an operation of transmitting the determined input to the electronic device may be performed between blocks 404 and 405.

Figure 5:
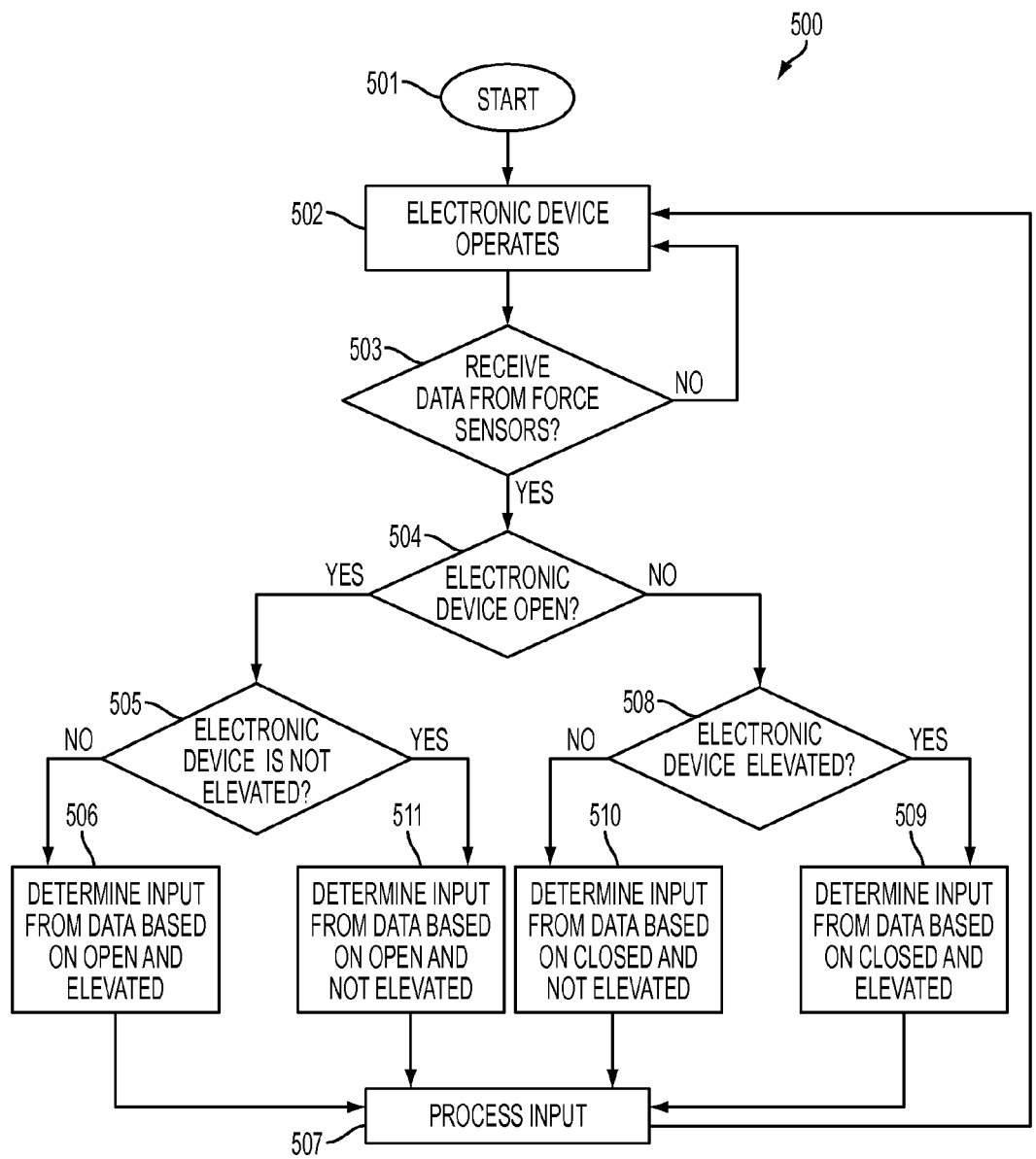
FIG. 5 is flow chart illustrating a second example method for controlling electronic devices using force sensors. This method may be performed by the system of FIG. 1.

FIG. 5 illustrates a second example method 500 for controlling electronic devices using force sensors. The method 500 may be performed by the system 100 of FIG. 1. The flow begins at block 501 and proceeds to block 502 where an electronic device operates. The flow then proceeds to block 503 where it is determined whether or not force data is received from one or more force sensors. If so, the flow proceeds to block 504. Otherwise, the flow returns to block 502 where the electronic device continues to operate.

At block 504, it is determined whether or not the electronic device has an 'open' status. If so, the flow proceeds to block 505. Otherwise, the flow proceeds to block 508.

At block 505, after it is determined that the electronic device has an open status, it is determine whether or not the electronic device has a 'not elevated' status. If so, the flow proceeds to block 511. Otherwise, the flow proceeds to block 506.

At block 506, after it is determined that the electronic device has an 'elevated' status, the force data is interpreted to determine one or more inputs that correspond to the force data based on a combined open status and an elevated status. The flow then proceeds to block 507 where the determined input is processed before the flow returns to block 502 and the electronic device continues to operate.

At block 511, after it is determined that the electronic device has a not elevated status, the force data is interpreted to determine one or more inputs that correspond to the force data based on a combined open status and a not elevated status. The flow then proceeds to block 507 where the determined input is processed before the flow returns to block 502 and the electronic device continues to operate.

At block 508, after it is determined that the electronic device has a 'closed' status, it is determine whether or not the electronic device has an elevated status. If so, the flow proceeds to block 509. Otherwise, the flow proceeds to block 510.

At block 509, after it is determined that the electronic device has an 'elevated' status, the force data is interpreted to determine one or more inputs that correspond to the force data based on a combined closed status and an elevated status. The flow then proceeds to block 507 where the determined input is processed before the flow returns to block 502 and the electronic device continues to operate.

At block 510, after it is determined that the electronic device has a not elevated status, the force data is interpreted to determine one or more inputs that correspond to the force data based on a combined closed status and a not elevated status. The flow then proceeds to block 507 where the determined input is processed before the flow returns to block 502 and the electronic device continues to operate.

Although the method 500 is illustrated and described above as including particular operations performed in a particular order, it is understood that this is for the purposes of example. In other implementations, different orders of the same and/or different operations may be performed without departing from the scope of the present disclosure. For example, in one or more implementations, various statuses of the electronic device other than open, closed, elevated, and/or not elevated may be determined and the force data may be interpreted as various inputs depending on the determined statuses.

Returning to FIG. 1, as illustrated, the force sensors 103a-103d are incorporated into the electronic device 101. However, it is understood that this is an example. In various cases, the force sensors may be incorporated into the electronic device and/or incorporated into a device that is external to the electronic device without departing from the present disclosure. In cases where the force sensors are incorporated into the electronic device, the electronic device may include one or more processing units that receive and interpret force data from the force sensors.

However, in cases where the force sensors 103a-103d are incorporated into a device that is external to the electronic device 101, either the external device and/or the electronic device may include one or more processing units that receive and interpret force data from the force sensors. In such cases where the external device includes the one or more processing units, the input as which the force data is interpreted may be communicated by the external device to the electronic device. However, in cases where the electronic device includes the one or more processing units, the external device may communicate the force data to the one or more processing units of the electronic device for interpretation.

For example, in some implementations, the force sensors 103a-103d may be incorporated into an external track pad or other external input device that is separate from the electronic device 101. Such an external track pad may include a plate or other housing that is operable to be supported on one or more surfaces by the moveable feet 102a-102d that include the force sensors. When force data is received, the force data may be interpreted as directional and/or other navigational information (whether by a processing unit of the external track pad or by sending the force data to a processing unit of the electronic device). By comparing force data from the various force sensors 103a-103d of the external track pad, the location where force was exerted on the external track pad may be determined (as the detected force may be greater closer to where a user pressed down, and closer to a particular force sensor, and may be lesser further from where a user pressed down, and closer to a different force sensor). By comparing current force data with previous force data, movement of a touch across the external track pad may be determinable. In some cases, the force data may be interpreted similar to the arrow keys of a keyboard (such as pressure near the top of the external track pad corresponds to an 'up arrow' input and so on).

Further, although the system 100 is illustrated and described above as including four moveable feet 102a-102d and four force sensors 103a-103d, it is understood that this is for the purposes of example. In various implementations, any number of moveable feet and/or force sensors may be used in a variety of different configurations in order to potentially support the electronic device 101 (and/or external device in which the moveable feet and/or force sensors are incorporated into) on one or more surfaces without departing from the scope of the present disclosure.

Additionally, although the system 100 is illustrated and described above as including four moveable feet 102a-102d and four force sensors 103a-103d located in the moveable feet, it is understood that this is for the purposes of example. In various implementations, moveable feet or other structures operable to support the electronic device on one or more surfaces may not be utilized. Instead, force sensors may be located in such embodiments in a bottom portion of the electronic device, a top portion of the electronic device, a hinge between a lid and base of the electronic device, a specific portion of the electronic device, and so on without departing from the scope of the present disclosure.

Figure 6:
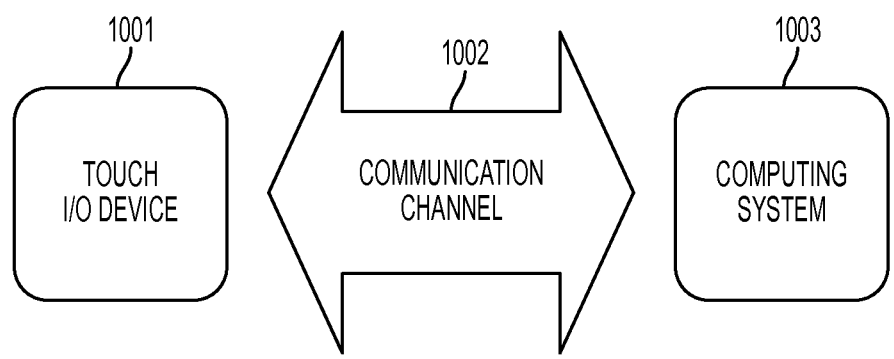
FIG. 6 shows a conceptual drawing of communication between a touch I/O device and a computing system.
Figure 7:
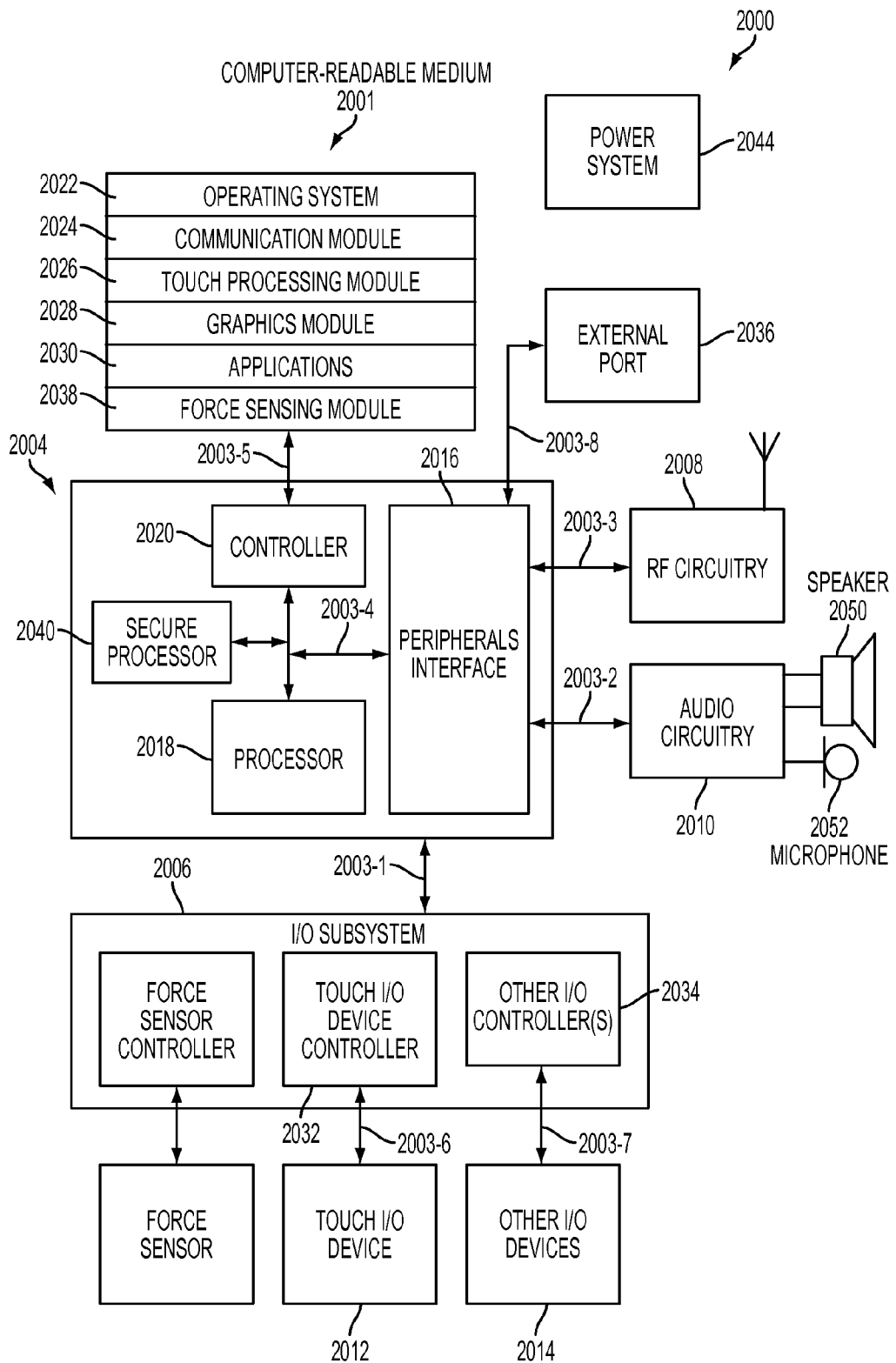
FIG. 7 shows a conceptual drawing of a system including force sensors.

FIG. 6 shows a conceptual drawing of communication between a touch I/O device and a computing system that may be utilized in various implementations of the present disclosure. FIG. 7 shows a conceptual drawing of a system force sensors that may be utilized in various implementations of the present disclosure.

Described embodiments may include touch I/O device 1001 that can receive touch input and force input (such as possibly including touch locations and applied force at those locations) for interacting with computing system 1003 (such as shown in the FIG. 6) via wired or wireless communication channel 1002. Touch I/O device 1001 may be used to provide user input to computing system 1003 in lieu of or in combination with other input devices such as a keyboard, mouse, or possibly other devices. In alternative embodiments, touch I/O device 1001 may be used in conjunction with other input devices, such as in addition to or in lieu of a mouse, trackpad, or possibly another pointing device. One or more touch I/O devices 1001 may be used for providing user input to computing system 1003. Touch I/O device 1001 may be an integral part of computing system 1003 (e.g., touch screen on a laptop) or may be separate from computing system 1003.

Touch I/O device 1001 may include a touch sensitive and/or force sensitive panel which is wholly or partially transparent, semitransparent, non-transparent, opaque or any combination thereof. Touch I/O device 1001 may be embodied as a touch screen, touch pad, a touch screen functioning as a touch pad (e.g., a touch screen replacing the touchpad of a laptop), a touch screen or touchpad combined or incorporated with any other input device (e.g., a touch screen or touchpad disposed on a keyboard, disposed on a trackpad or other pointing device), any multi-dimensional object having a touch sensitive surface for receiving touch input, or another type of input device or input/output device.

In one example, touch I/O device 1001 embodied as a touch screen may include a transparent and/or semitransparent touch sensitive and force sensitive panel at least partially or wholly positioned over at least a portion of a display. (Although the touch sensitive and force sensitive panel is described as at least partially or wholly positioned over at least a portion of a display, in alternative embodiments, at least a portion of circuitry or other elements used in embodiments of the touch sensitive and force sensitive panel may be at least positioned partially or wholly positioned under at least a portion of a display, interleaved with circuits used with at least a portion of a display, or otherwise.) According to this embodiment, touch I/O device 1001 functions to display graphical data transmitted from computing system 1003 (and/or another source) and also functions to receive user input. In other embodiments, touch I/O device 1001 may be embodied as an integrated touch screen where touch sensitive and force sensitive components/devices are integral with display components/devices. In still other embodiments a touch screen may be used as a supplemental or additional display screen for displaying supplemental or the same graphical data as a primary display and to receive touch input, including possibly touch locations and applied force at those locations.

Touch I/O device 1001 may be configured to detect the location of one or more touches or near touches on device 1001, and where applicable, force of those touches, based on capacitive, resistive, optical, acoustic, inductive, mechanical, chemical, or electromagnetic measurements, in lieu of or in combination or conjunction with any phenomena that can be measured with respect to the occurrences of the one or more touches or near touches, and where applicable, force of those touches, in proximity to device 1001. Software, hardware, firmware or any combination thereof may be used to process the measurements of the detected touches, and where applicable, force of those touches, to identify and track one or more gestures. A gesture may correspond to stationary or non-stationary, single or multiple, touches or near touches, and where applicable, force of those touches, on touch I/O device 1001. A gesture may be performed by moving one or more fingers or other objects in a particular manner on touch I/O device 1001 such as tapping, pressing, rocking, scrubbing, twisting, changing orientation, pressing with varying pressure and the like at essentially the same time, contiguously, consecutively, or otherwise. A gesture may be characterized by, but is not limited to a pinching, sliding, swiping, rotating, flexing, dragging, tapping, pushing and/or releasing, or other motion between or with any other finger or fingers, or any other portion of the body or other object. A single gesture may be performed with one or more hands, or any other portion of the body or other object by one or more users, or any combination thereof.

Computing system 1003 may drive a display with graphical data to display a graphical user interface (GUI). The GUI may be configured to receive touch input, and where applicable, force of that touch input, via touch I/O device 1001. Embodied as a touch screen, touch I/O device 1001 may display the GUI. Alternatively, the GUI may be displayed on a display separate from touch I/O device 1001. The GUI may include graphical elements displayed at particular locations within the interface. Graphical elements may include but are not limited to a variety of displayed virtual input devices including virtual scroll wheels, a virtual keyboard, virtual knobs or dials, virtual buttons, virtual levers, any virtual UI, and the like. A user may perform gestures at one or more particular locations on touch I/O device 1001 which may be associated with the graphical elements of the GUI. In other embodiments, the user may perform gestures at one or more locations that are independent of the locations of graphical elements of the GUI. Gestures performed on touch I/O device 1001 may directly or indirectly manipulate, control, modify, move, actuate, initiate or generally affect graphical elements such as cursors, icons, media files, lists, text, all or portions of images, or the like within the GUI. For instance, in the case of a touch screen, a user may directly interact with a graphical element by performing a gesture over the graphical element on the touch screen. Alternatively, a touch pad generally provides indirect interaction. Gestures may also affect non-displayed GUI elements (e.g., causing user interfaces to appear) or may affect other actions within computing system 1003 (e.g., affect a state or mode of a GUI, application, or operating system). Gestures may or may not be performed on touch I/O device 1001 in conjunction with a displayed cursor. For instance, in the case in which gestures are performed on a touchpad, a cursor (or pointer) may be displayed on a display screen or touch screen and the cursor may be controlled via touch input, and where applicable, force of that touch input, on the touchpad to interact with graphical objects on the display screen. In other embodiments in which gestures are performed directly on a touch screen, a user may interact directly with objects on the touch screen, with or without a cursor or pointer being displayed on the touch screen.

Feedback may be provided to the user via communication channel 1002 in response to or based on the touch or near touches, and where applicable, force of those touches, on touch I/O device 1001. Feedback may be transmitted optically, mechanically, electrically, olfactory, acoustically, haptically, or the like or any combination thereof and in a variable or non-variable manner.

Attention is now directed towards embodiments of a system architecture that may be embodied within any portable or non-portable device including but not limited to a communication device (e.g. mobile phone, smart phone), a multimedia device (e.g., MP3 player, TV, radio), a portable or handheld computer (e.g., tablet, netbook, laptop), a desktop computer, an All-In-One desktop, a peripheral device, or any other (portable or non-portable) system or device adaptable to the inclusion of system architecture 2000, including combinations of two or more of these types of devices. FIG. 7 shows a block diagram of one embodiment of system 2000 that generally includes one or more computer-readable mediums 2001, processing system 2004, Input/Output (I/O) subsystem 2006, electromagnetic frequency circuitry, such as possibly radio frequency (RF) or other frequency circuitry 2008 and audio circuitry 2010. These components may be coupled by one or more communication buses or signal lines 2003. Each such bus or signal line may be denoted in the form 2003-X, where X can be a unique number. The bus or signal line may carry data of the appropriate type between components; each bus or signal line may differ from other buses/lines, but may perform generally similar operations.

It should be apparent that the architecture shown in FIG. 6 and FIG. 7 is only one example architecture of system 2000, and that system 2000 could have more or fewer components than shown, or a different configuration of components. The various components shown in FIGS. 1-3 can be implemented in hardware, software, firmware or any combination thereof, including one or more signal processing and/or application specific integrated circuits.

RF circuitry 2008 is used to send and receive information over a wireless link or network to one or more other devices and includes well-known circuitry for performing this function. RF circuitry 2008 and audio circuitry 2010 are coupled to processing system 2004 via peripherals interface 2016. Interface 2016 includes various known components for establishing and maintaining communication between peripherals and processing system 2004. Audio circuitry 2010 is coupled to audio speaker 2050 and microphone 2052 and includes known circuitry for processing voice signals received from interface 2016 to enable a user to communicate in real-time with other users. In some embodiments, audio circuitry 2010 includes a headphone jack (not shown).

Peripherals interface 2016 couples the input and output peripherals of the system to processor 2018 and computer-readable medium 2001. One or more processors 2018 communicate with one or more computer-readable mediums 2001 via controller 2020. Computer-readable medium 2001 can be any device or medium that can store code and/or data for use by one or more processors 2018. Medium 2001 can include a memory hierarchy, including but not limited to cache, main memory and secondary memory. The memory hierarchy can be implemented using any combination of RAM (e.g., SRAM, DRAM, DDRAM), ROM, FLASH, magnetic and/or optical storage devices, such as disk drives, magnetic tape, CDs (compact disks) and DVDs (digital video discs). Medium 2001 may also include a transmission medium for carrying information-bearing signals indicative of computer instructions or data (with or without a carrier wave upon which the signals are modulated). For example, the transmission medium may include a communications network, including but not limited to the Internet (also referred to as the World Wide Web), intranet(s), Local Area Networks (LANs), Wide Local Area Networks (WLANs), Storage Area Networks (SANs), Metropolitan Area Networks (MAN) and the like.

One or more processors 2018 run various software components stored in medium 2001 to perform various functions for system 2000. In some embodiments, the software components include operating system 2022, communication module (or set of instructions) 2024, touch and applied force processing module (or set of instructions) 2026, graphics module (or set of instructions) 2028, one or more applications (or set of instructions) 2030, and force sensing module (or set of instructions) 2038. Each of these modules and above noted applications correspond to a set of instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise rearranged in various embodiments. In some embodiments, medium 2001 may store a subset of the modules and data structures identified above. Furthermore, medium 2001 may store additional modules and data structures not described above.

Operating system 2022 includes various procedures, sets of instructions, software components and/or drivers for controlling and managing general system tasks (e.g., memory management, storage device control, power management, etc.) and facilitates communication between various hardware and software components.

Communication module 2024 facilitates communication with other devices over one or more external ports 2036 or via RF circuitry 2008 and includes various software components for handling data received from RF circuitry 2008 and/or external port 2036.

Graphics module 2028 includes various known software components for rendering, animating and displaying graphical objects on a display surface. In embodiments in which touch I/O device 2012 is a touch sensitive and force sensitive display (e.g., touch screen), graphics module 2028 includes components for rendering, displaying, and animating objects on the touch sensitive and force sensitive display.

One or more applications 2030 can include any applications installed on system 2000, including without limitation, a browser, address book, contact list, email, instant messaging, word processing, keyboard emulation, widgets, JAVA-enabled applications, encryption, digital rights management, voice recognition, voice replication, location determination capability (such as that provided by the global positioning system, also sometimes referred to herein as "GPS"), a music player, and otherwise.

Touch and applied force processing module 2026 includes various software components for performing various tasks associated with touch I/O device 2012 including but not limited to receiving and processing touch input and applied force input received from I/O device 2012 via touch I/O device controller 2032.

System 2000 may further include force sensing module 2038 for performing force sensing.

I/O subsystem 2006 is coupled to touch I/O device 2012 and one or more other I/O devices 2014 for controlling or performing various functions. Touch I/O device 2012 communicates with processing system 2004 via touch I/O device controller 2032, which includes various components for processing user touch input and applied force input (e.g., scanning hardware). One or more other input controllers 2034 receives/sends electrical signals from/to other I/O devices 2014. Other I/O devices 2014 may include physical buttons, dials, slider switches, sticks, keyboards, touch pads, additional display screens, or any combination thereof.

If embodied as a touch screen, touch I/O device 2012 displays visual output to the user in a GUI. The visual output may include text, graphics, video, and any combination thereof. Some or all of the visual output may correspond to user-interface objects. Touch I/O device 2012 forms a touch-sensitive and force-sensitive surface that accepts touch input and applied force input from the user. Touch I/O device 2012 and touch screen controller 2032 (along with any associated modules and/or sets of instructions in medium 2001) detects and tracks touches or near touches, and where applicable, force of those touches (and any movement or release of the touch, and any change in the force of the touch) on touch I/O device 2012 and converts the detected touch input and applied force input into interaction with graphical objects, such as one or more user-interface objects. In the case in which device 2012 is embodied as a touch screen, the user can directly interact with graphical objects that are displayed on the touch screen. Alternatively, in the case in which device 2012 is embodied as a touch device other than a touch screen (e.g., a touch pad or trackpad), the user may indirectly interact with graphical objects that are displayed on a separate display screen embodied as I/O device 2014.

Touch I/O device 2012 may be analogous to the multi-touch sensitive surface described in the following U.S. Pat. No. 6,323,846 (Westerman et al.), U.S. Pat. No. 6,570,557 (Westerman et al.), and/or U.S. Pat. No. 6,677,932 (Westerman), and/or U.S. Patent Publication 2002/0015024A1, each of which is hereby incorporated by reference.

Embodiments in which touch I/O device 2012 is a touch screen, the touch screen may use LCD (liquid crystal display) technology, LPD (light emitting polymer display) technology, OLED (organic LED), or OEL (organic electro luminescence), although other display technologies may be used in other embodiments.

Feedback may be provided by touch I/O device 2012 based on the user's touch, and applied force, input as well as a state or states of what is being displayed and/or of the computing system. Feedback may be transmitted optically (e.g., light signal or displayed image), mechanically (e.g., haptic feedback, touch feedback, force feedback, or the like), electrically (e.g., electrical stimulation), olfactory, acoustically (e.g., beep or the like), or the like or any combination thereof and in a variable or non-variable manner.

System 2000 also includes power system 2044 for powering the various hardware components and may include a power management system, one or more power sources, a recharging system, a power failure detection circuit, a power converter or inverter, a power status indicator and any other components typically associated with the generation, management and distribution of power in portable devices.

In some embodiments, peripherals interface 2016, one or more processors 2018, and memory controller 2020 may be implemented on a single chip, such as processing system 2004. In some other embodiments, they may be implemented on separate chips.

In one embodiment, an example system includes a force sensor coupled to the touch I/O device 2012, such as coupled to a force sensor controller. For example, the force sensor controller can be included in the I/O subsystem 2006. The force sensor controller can be coupled to a processor or other computing device, such as the processor 2018 or the secure processor 2040, with the effect that information from the force sensor controller can be measured, calculated, computed, or otherwise manipulated. In one embodiment, the force sensor can make use of one or more processors or other computing devices, coupled to or accessible to the touch I/O device 2012, such as the processor 2018, the secure processor 2040, or otherwise. In alternative embodiments, the force sensor can make use of one or more analog circuits or other specialized circuits, coupled to or accessible to the touch I/O device 2012, such as might be coupled to the I/O subsystem 2006. It should be appreciated that many of the components described herein may be optional and omitted in some embodiments, such as the secure processor 2040, or combined, such as the processor and secure processor. The same is generally true for all figures described herein.

As discussed above and as illustrated in the accompanying figures, the present disclosure discloses systems and methods for controlling electronic devices using force sensors. A plurality of force sensors may be configured such that they are operable to support one or more housings on one or more surfaces. When force is exerted on the housing, this force may be measured by the force sensors as force data. This force data may be interpreted (such as by one or more processing units) as at least one input for an electronic device. In some implementations, the electronic device may include various different statuses. In such implementations, the status of the electronic device may be determined and the input that the force data is interpreted as may depend on the determined status of the electronic device. In this way, an input device that may not require extensive hardware, special surfaces, and/or other costly components may be provided. Further, such an input device may enable the electronic device itself to be utilized as an input device.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The described disclosure may be provided as a computer program product, or software, that may include a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

We claim:

1. A method for controlling electronic devices using force sensors, the method comprising:
   receiving force data, utilizing at least one processing unit, from a plurality of force sensors each connected to one of a number of movable feet that are operable to support at least one housing on at least one surface wherein each of the plurality of force sensors detects a capacitive change between a pair of capacitive plates separated by flexible material that is compressed by movement of the respective one of the number of moveable feet; and
   interpreting, utilizing the at least one processing unit, the force data as:
      at least one first type of input for an electronic device when the at least one processing unit determines that an input device other than the plurality of force sensors is available; and
      at least one second type of input for the electronic device when the at least one processing unit determines that the input device is unavailable.

2. The method of claim 1, wherein said operation of interpreting, utilizing the at least one processing unit, the force data as at least one first type of input for an electronic device further comprises comparing data from at least one first force sensor of the plurality of force sensors with data from at least one second force sensor of the plurality of force sensors to determine at least one navigational instruction.

3. The method of claim 1, further comprising determining a status of the electronic device, wherein said operation of interpreting, utilizing the at least one processing unit, the force data as at least one first type of input for an electronic device further comprises interpreting the force data as at least one first input of the first type of input when the status is a first status and as at least one second input of the first type of input when the status is a second status.

4. The method of claim 3, wherein the first status corresponds at least to the at least one housing being positioned on the at least one surface and the second status corresponds at least to the at least one housing not being positioned on the at least one surface.

5. The method of claim 1, wherein the determination that the input device is unavailable corresponds at least to a closed lid of the electronic device and the determination that the input device is available corresponds at least to an open lid of the electronic device.

6. The method of claim 3, wherein the first status corresponds at least to an active status and the second status corresponds at least to at least one inactive status.

7. The method of claim 3, wherein the first status corresponds at least to a program executing on the electronic device and the second status corresponds at least to the program not executing on the electronic device.

8. The method of claim 1, wherein the at least one first type of input comprises at least one instruction for at least one application executing on the electronic device.

9. A system for controlling electronic devices using force sensors comprising:
   at least one housing;
   a plurality of force sensors each connected to one of a number of movable feet that are operable to support the at least one housing on at least one surface; and
   at least one processing unit, communicably coupled to the plurality of force sensors that interprets force data received from at least one of the plurality of force sensors as at least one first kind of input for an electronic device when the at least one processing unit determines that an input device other than the plurality of force sensors is available and at least one second kind of input for the electronic device when the at least one processing unit determines that the input device is unavailable.

10. The system of claim 9, wherein the at least one processing unit determines a status of the electronic device and interprets force data received from at least one of the plurality of force sensors as at least one first input of the first kind of input when the status is a first status and as at least one second input of the first kind of input when the status is a second status.

11. The system of claim 9, wherein the determination that the input device is unavailable corresponds at least to a closed lid of the electronic device and the determination that the input device is available corresponds at least to an open lid of the electronic device.

12. The system of claim 10, wherein the first status corresponds at least to an active status and the second status corresponds at least to at least one inactive status.

13. The system of claim 10, wherein the first status corresponds at least to a program executing on the electronic device and the second status corresponds at least to the program not executing on the electronic device.

14. The system of claim 10, wherein the first status corresponds at least to the at least one housing being positioned on the at least one surface and the second status corresponds at least to the at least one housing not being positioned on the at least one surface.

15. The system of claim 9, wherein the at least one housing is incorporated into the electronic device.

16. The system of claim 9, wherein the at least one housing is external to the electronic device.

17. The system of claim 16, wherein the at least one processing unit is incorporated into the electronic device.

18. The system of claim 9, wherein the at least one first kind of input comprises at least one navigational instruction.

19. The system of claim 9, wherein the at least one first kind of input comprises at least one instruction for at least one application executing on the electronic device.

20. An electronic device, comprising:
at least one housing;
a plurality of force sensors each connected to one of a number of movable feet that are operable to support the at least one housing on at least one surface and each detecting force caused by movement of the respective one of the number of moveable feet;
an input device other than the plurality of force sensors; and
at least one processing unit, communicably coupled to the plurality of force sensors that determines a status of the electronic device, the status relating to whether or not the input device is available, and interprets force data received from at least one of the plurality of force sensors as at least one first input when the status is a first status and as at least one second input when the status is a second status.

* * * * *